United States Patent
Hildbrand et al.

[19]

[11] Patent Number: 6,140,699
[45] Date of Patent: Oct. 31, 2000

[54] MOLDING FOR HOLDING HEAT SINKS IN A CLAMPED STACK

[75] Inventors: Urs Hildbrand, Zürich; Thomas Keller, Gipf-Oberfrick; Christoph Stemmler, Baden, all of Switzerland

[73] Assignee: Asea Brown Boveri AG, Baden, Switzerland

[21] Appl. No.: 09/345,510

[22] Filed: Jul. 1, 1999

[30] Foreign Application Priority Data

Jul. 8, 1998 [DE] Germany .............................. 198 30 424

[51] Int. Cl.⁷ .................................................. H01L 23/34
[52] U.S. Cl. .......................................... 257/714; 257/723
[58] Field of Search ................................... 257/177, 714, 257/723, 675

[56] References Cited

U.S. PATENT DOCUMENTS 4,029,141  6/1977  Ferrari et al. ............................ 257/177

FOREIGN PATENT DOCUMENTS 6945492   3/1970   Germany .
4025885A1 2/1992   Germany .
09092782A 4/1997   Japan .

OTHER PUBLICATIONS

"Serienschaltung von GTO–Thyristoren fur Frequenzumrichter hoher Leistung", Steimer, et al., ABB Technik, May 1996, pp. 14–20.

*Primary Examiner*—Roy Potter
*Attorney, Agent, or Firm*—Burns, Doane, Swecker & Mathis, L.L.P.

[57] ABSTRACT

In a semiconductor clamped stack, in particular for high-power converters, a plurality of power semiconductor components are arranged alternately together with water-cooled cooling cans in a stack. A clear arrangement of all the components and supplies is achieved, and defective semiconductor components can be replaced more easily, in that a molding (10) according to the invention is used for holding in each case one heat sink and one power semiconductor component. Rails and latching-in fasteners are provided for guiding and holding the latter.

10 Claims, 3 Drawing Sheets

MOLDING FOR HOLDING HEAT SINKS IN A CLAMPED STACK

BACKGROUND OF THE INVENTION

1. Field of the Invention

The present invention relates to the field of power semiconductor technology. It relates to a holder for heat sinks, and to the preferred use in a semiconductor clamped stack, in particular for high-power converters.

2. Discussion of Background

A semiconductor clamped stack is known, for example, from the document P. Steimer et al. "Serieschaltung von GTO-Thyristoren für Frequenzumrichter hoher Leistung" [Series circuit of GTO thyristors for high-power frequency converters], ABB Technik 5 (1996), pages 14–20.

In known water-cooled high-power converters, a plurality of power semiconductor components are alternately combined in a series of circuits with cooling cans through which water flows, in order to form a stack. The required electrical and thermal characteristics are achieved by mechanical bracing by means of tie rods. In order to replace a defective power semiconductor component, the clamped stack is loosened, during which process all the components must still be held in their position centered with respect to the stack axis.

A large number of plastic parts are provided for holding and centering the cooling cans and the power semiconductor components, and for fixing the cooling water supply line, the cooling water outlet line, and the supply and control cables. These separate holders involve greater assembly effort and are not conducive to rapid replacement of individual components.

In the latest generation of power semiconductor switches, a GTO thyristor accommodated in a presspack case is connected to a board, on which the associated drive unit is also arranged. The power semiconductor components and drive thus form a unit (see the document mentioned above, FIG. 5). Owing to the weight of the drive unit, it and the board on which it is mounted must likewise be supported in order to improve the mechanical stability.

SUMMARY OF THE INVENTION

Accordingly, one object of the invention is to provide a novel apparatus for holding components in a semiconductor clamped stack, which apparatus is distinguished by a considerably simplified and more compact design, and allows quick and easy replacement of individual power semiconductor components.

The object is achieved by a new molding for simultaneously holding and centering a heat sink as well as a power semiconductor component which is immediately adjacent to it. This results in a new basic unit, comprising the molding according to the invention, a power semiconductor component and a heat sink, which basic unit offers maximum flexibility for constructing a multi-component clamped stack. The power semiconductor component and the heat sink are positioned such that one electrode of the power semiconductor component and one cooling surface of the heat sink are opposite one another and are superimposed. When the stack is being braced, one electrode and one cooling surface are in each case pressed against one another, as a result of which the thermal and electrical conductivity between the components of the stack are optimized.

A first preferred embodiment is distinguished by the fact that both the heat sink and the power semiconductor component are connected to the molding according to the invention by means of a detachable fastener which latches in. This allows, in particular, the power semiconductor component to be replaced easily in that, when the tensile force on the power semiconductor component is sufficient, the corresponding fastener releases this component again.

A second preferred embodiment is distinguished by the fact that, in addition to the stack-centered final position of the two components, the invention also defines the way in which this final position can be reached. To this end, the invention provides the existence of installation aids for the power semiconductor component, which aids comprise guide means for the molding according to the invention and guide elements which are firmly mounted on the power semiconductor component. These guide elements are, for example, configured as studs or vanes, and are directly connected to the power semiconductor component, being guided by an appropriate mating piece (guide means), which is associated with the molding, in the form of a rail or groove.

Specifically, during removal of a power semiconductor component from the molding, these guide means allow the power semiconductor component to be guided such that the contact surface of the heat sink and the electrode of the power semiconductor component are not damaged. To do this, the entire stack is first of all loosened, and the individual basic units, which can move parallel to the stack axis (since they are guided, for example, by the tie rods which run parallel to the stack), are somewhat separated from one another. During removal from the holder, the power semiconductor component is moved thanks to the guide means such that its electrode is disconnected obliquely from the corresponding contact surface of the heat sink, and thus cannot scratch the contact surface. This is achieved in a simple manner by means, for example, of a guide groove, which is not parallel to the contact surface of the heat sink.

A next preferred embodiment relates to the use of power semiconductor components of the type mentioned initially, in which the semiconductor is located on a board together with its drive. In this case, the guide elements are not directly attached to the power semiconductor component but are attached to said board, and are also used for mechanically supporting the drive unit. If necessary, the board may itself be the guide element and may be inserted directly in corresponding guide grooves.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
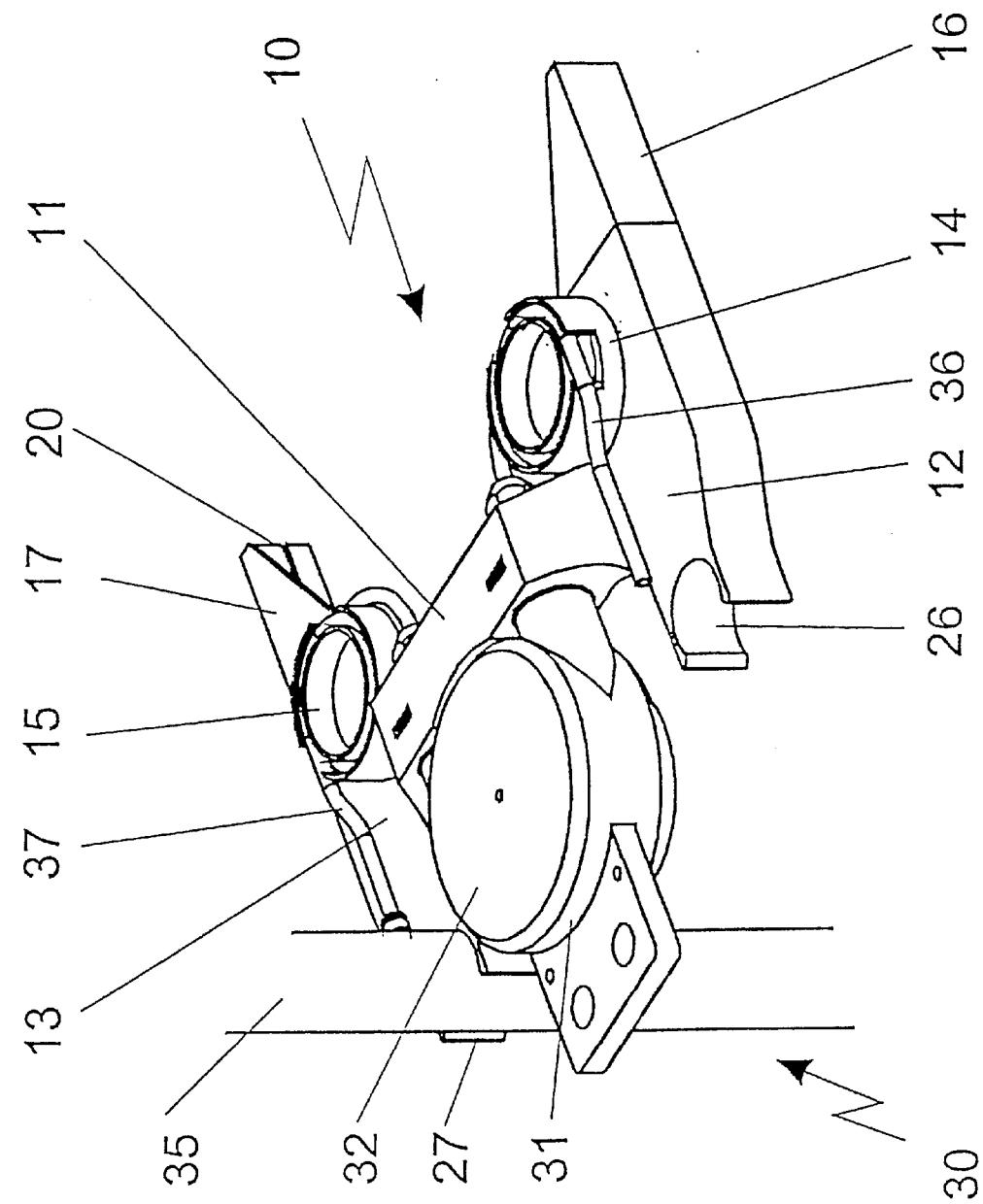
FIG. 1 shows a perspective view of a molding according to the invention, together with parts of the cooling apparatus.
Figure 2:
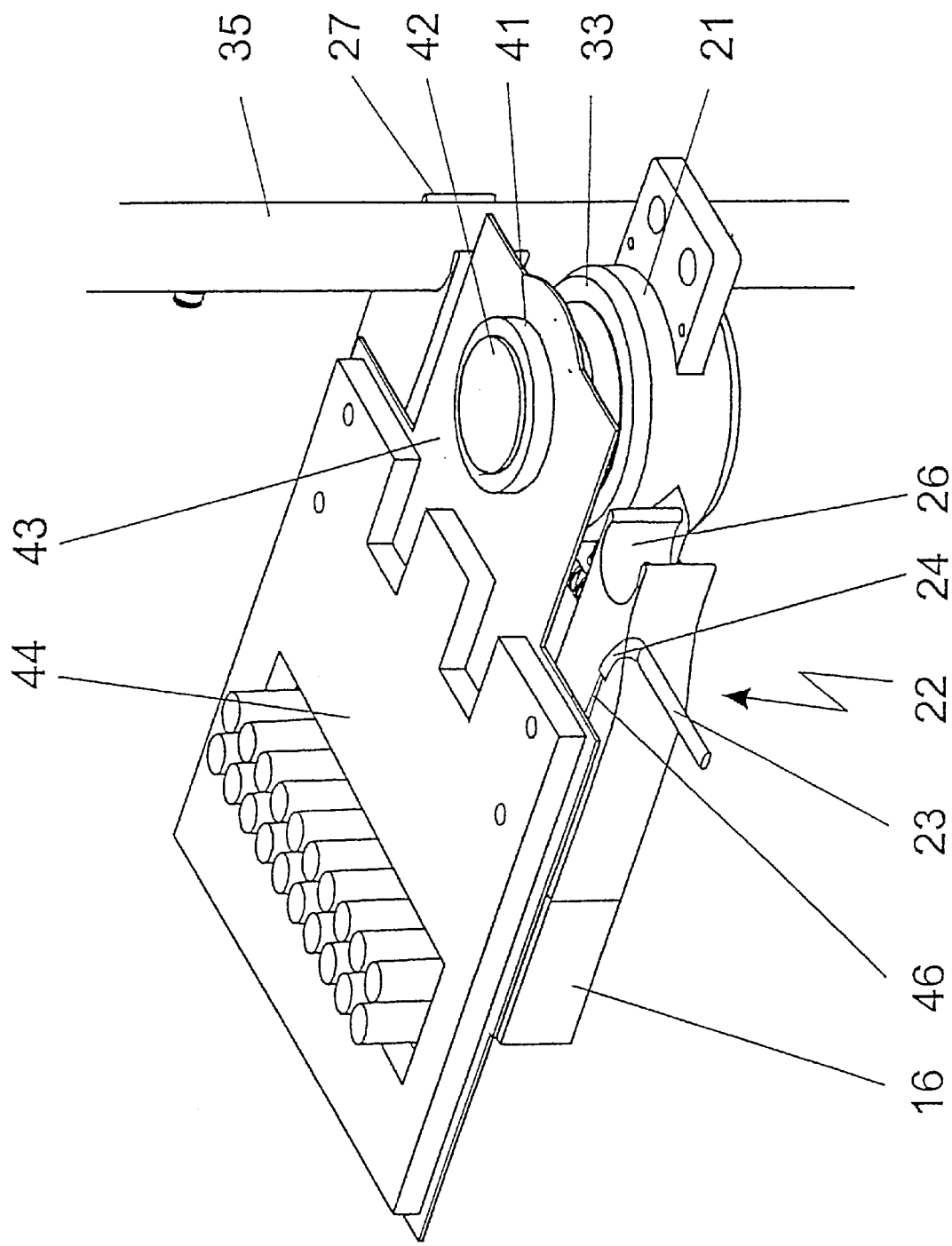
FIG. 2 shows the same, but in addition a power semiconductor component mounted on a board.

Referring now to the drawings, wherein like reference numerals designate identical or corresponding parts throughout the several views, FIG. 1 and FIG. 2 show perspective views of a preferred exemplary embodiment of a molding 10 according to the invention, together with a number of components of the cooling apparatus 30. FIG. 2 also shows a power semiconductor component 41, which is firmly connected to a board 43.

The cooling apparatus 30 comprises a cooling can 31 through which water flows and which is mounted on the corresponding holder 11 of the molding 10 according to the invention. The cooling water supply and outlet lines 36, 37 between the cooling can 31 and the cooling water distribution tube (not shown) and the cooling water collecting tube 35 may possibly need to be of a certain minimum length. This is because any potential difference between the cooling can 31 and the electrically conductive tube 35 will produce a corrosive electrolysis current, which must not exceed a certain value. In order to achieve the necessary length, the lines 36, 37 may be configured in a spiral shape. Their holders 14, 15 prevent contact between two points on the cooling water lines that are at different electrostatic potentials.

The power semiconductor component 41 is accommodated in a cylindrical case, which is provided on both end faces with flat circular electrodes 42 (anodes, cathodes) for electrical and thermal coupling. A cooling can 31, which is likewise cylindrical, is arranged on both sides of each power semiconductor component in the semiconductor stack, in such a manner that its contact surfaces 32, 33 come into contact with the electrodes 42 of the power semiconductor component. By using the molding according to the invention, a power semiconductor component is in each case combined with an adjacent cooling can, in pairs.

Figure 3:
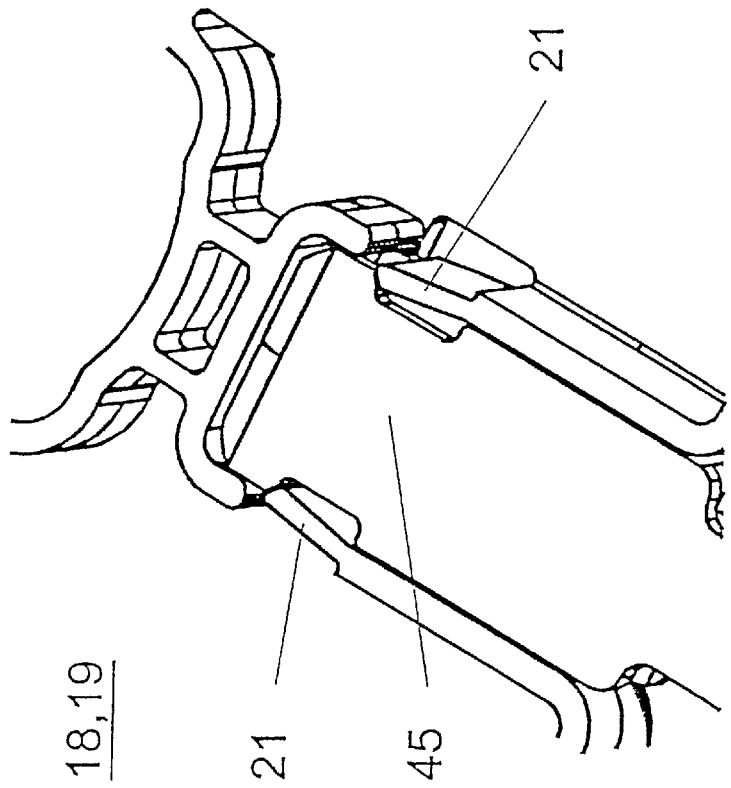
FIG. 3 shows a detail of the latching-in fastener.

The power semiconductor component 41 shown in FIG. 2 is a GTO thyristor which is firmly connected to a board 43. The holders 12, 13, which are responsible for correct positioning of the power semiconductor component 41, in this case do not act directly on the power semiconductor component 41. The central part of the holder 12, 13 is a latching-in fastener 18, 19, whose mating piece 45 is mounted on the board 43. Such a latching-in fastener is shown in FIG. 3 together with its mating piece 45, which is inserted into the fastener and is held firmly by the two lugs 21. These are in turn of such a size that, when stressed in tension, they once again release the mating piece 45, and thus the power semiconductor component 41.

Figure 4:
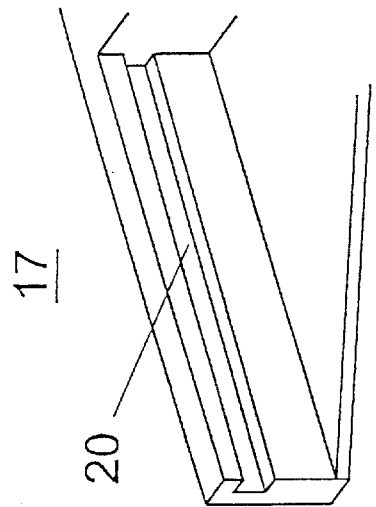
FIG. 4 shows a detail of the guide groove.

During installation, the power semiconductor component 41 is not guided directly, but by means of guide elements (not shown) which are mounted on the board 43. The guide means 16, 17 responsible for this have the form of vane-shaped expanded regions, as part of the molding 10. There are guide grooves 20 on their inside, which, during installation of the power semiconductor component 41, guide the board 43, and thus the power semiconductor component, which is firmly connected to it, as well (FIG. 4). As a result of the inclination of this groove, the power semiconductor component is moved in such a manner that its electrode 42 does not touch the contact surface 33 of the cooling can 31 until the final position is reached, and any friction prior to this between the two surfaces 42, 33 is avoided. Once the power semiconductor component has been installed, the board and the drive unit 44 located on it are additionally supported and mechanically stabilized by the guide means 16, 17.

The apparatus according to the invention is produced from electrically insulating material, preferably plastic, and can be produced economically using the injection-molding process.

If the drive unit 44 is also contained on the board 43, this results in a further simplification for replacement of a power semiconductor component 41, in that the contact apparatus 22 for supplying the drive unit 44 is also integrated in the molding 10. The supply cable 23 is preferably passed through a cutout in the molding to a socket 24, which is firmly anchored in the molding. A plug 46, as the mating piece for the socket 24, is located on the board 43. When the power semiconductor component is now installed, an electrical contact is made between the supply cable 23 and the drive 44 as soon as the power semiconductor component reaches the final position, centered with respect to the stack. Thus, when a power semiconductor component is being replaced, all that now need be done is to detach a control cable, where appropriate, so that it is separated from the old drive unit, and attach it to the new drive unit.

In addition to the said features, further advantageous embodiments are provided for use of the moldings according to the invention in a semiconductor clamped stack.

The tie rods which are required for bracing the stack run parallel to the stack. In the present example, they are in the form of tubes 35 and are at the same time used to distribute and collect the cooling water. The moldings according to the invention are now, for their part, mounted thereon, so that the components held by them are centered in the stack. FIG. 1 shows how a molding is fitted to the cooling water collecting tube 35 by means of a clip fastener 25, 26. In the process, care must be taken to ensure that the moldings are not completely blocked in the direction of the stack axis, since it must still be possible to move them during tightening and loosening of the stack. On the other hand, the clip fastener 25, 26 must be capable of being loaded with tensile forces in the plane at right angles to the stack and to the cooling-water tube, that is to say it must never flex earlier than the latching-in fastener 18, 19 when loaded in tension.

Overall, use of a plurality of moldings according to the invention results in a semiconductor clamped stack which is distinguished by simplified design and has increased mechanical stability. Furthermore, the replacement of defective power semiconductor components is simplified, since rails and latching-in fasteners are provided for guiding and holding them. The multifunctional holder according to the invention may be produced easily and economically as an injection-molded part.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A molding comprising first holding means for holding a liquid-cooled heat sink, which has at least one contact surface, and which is used for cooling at least one power semiconductor component having at least one flat electrode;
   the molding including second holding means for holding the power semiconductor component,
   which second holding means position the electrode of the power semiconductor component essentially such that it is superimposed alongside the contact surface of the heat sink.

2. The molding as claimed in claim 1, wherein the holding means have at least one fastener which latches in and can be detached again.

3. The molding as claimed in claim 2, wherein guide means are provided for guiding a guide element during installation and removal of the power semiconductor component which is connected to it.

4. The molding as claimed in claim 3, wherein the guide means or the guide element are/is designed in such a manner that, during removal of the power semiconductor component, the electrode of the power semiconductor component is disconnected from the contact surface of the heat sink by a guided movement which is not entirely in the plane of the contact surface.

5. The molding as claimed in claim 4, wherein the guide means comprise grooves or rails.

6. The molding as claimed in claim 5, wherein the guide element is a board, which is connected to the power semiconductor component.

7. The molding as claimed in claim 6, wherein an electrical contact apparatus is provided for supplying the drive unit which is associated with the power semiconductor component, is connected to a supply cable and makes an electrical operative connection with the drive unit, or interrupts this connection, respectively, during installation and, respectively, removal of the power semiconductor component.

8. The molding as claimed in claim 7, wherein third holding means are provided for holding at least one cooling liquid line.

9. The molding as claimed in claim 1, wherein said molding comprises a plastic body produced using the injection-molding process.

10. Use of at least one molding as claimed in claim 1, for holding and centering power semiconductor components and heat sinks in a semiconductor clamped stack, in which a plurality of power semiconductor components are arranged alternately together with liquid-cooled heat sinks, wherein the molding itself is connected to at least one rod, which runs parallel to the clamped stack, in such a manner that the molding remains movable in the stack direction.

* * * * *